(12) United States Patent
Bae

(10) Patent No.: US 6,924,685 B2
(45) Date of Patent: Aug. 2, 2005

(54) DEVICE FOR CONTROLLING A SETUP/HOLD TIME OF AN INPUT SIGNAL

(75) Inventor: Seung Cheol Bae, Icheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 10/608,292

(22) Filed: Jun. 30, 2003

(65) Prior Publication Data

US 2004/0119520 A1 Jun. 24, 2004

(30) Foreign Application Priority Data

Dec. 21, 2002 (KR) .................................. 10-2002-0082033

(51) Int. Cl.[7] .............................................. H03H 11/26
(52) U.S. Cl. ...................................... 327/276; 327/284
(58) Field of Search ................................ 327/261–264, 327/268, 276–278, 283–285, 290, 158, 161; 365/194, 193, 189.05, 233, 230.06

(56) References Cited

U.S. PATENT DOCUMENTS

| | | | |
|---|---|---|---|
| 5,107,153 A | 4/1992 | Osaki et al. | |
| 5,767,719 A | * 6/1998 | Furuchi et al. | ............. 327/281 |
| 5,986,943 A | 11/1999 | Isa | ......................... 365/189.04 |
| 6,282,132 B1 | 8/2001 | Brown et al. | ................ 365/193 |
| 6,297,679 B1 | 10/2001 | Kim | ........................... 327/276 |
| 6,366,524 B1 | 4/2002 | Abedifard | .............. 365/230.06 |
| 6,426,900 B1 | * 7/2002 | Maruyama et al. | ......... 365/194 |
| 6,501,307 B1 | * 12/2002 | Yen | ............................. 327/113 |
| 6,552,587 B2 | * 4/2003 | Kim et al. | .................. 327/158 |
| 6,630,850 B2 | * 10/2003 | Eto et al. | .................... 327/141 |

FOREIGN PATENT DOCUMENTS

| | | |
|---|---|---|
| JP | 9162706 | 6/1997 |
| JP | 2000-163994 | 6/2000 |
| JP | 2001-126487 | 5/2001 |
| JP | 2001-256178 | 9/2001 |
| JP | 2002-76878 | 3/2002 |
| KR | 1020010029703 | 4/2001 |

* cited by examiner

*Primary Examiner*—Minh Nguyen
(74) *Attorney, Agent, or Firm*—Heller Ehrman White and McAuliffe LLP

(57) ABSTRACT

The device for controlling a setup/hold time of an input signal can change a setup/hold time of various control signals applied from an input buffer without physically changing the control device. The device for controlling a setup/hold time of an input signal has transmission gates for performing selectively switching operations according to a decoded test mode control signal, thereby selectively using a signal delay device in driving of drivers to appropriately control the setup/hold time of various control signals applied from a global bus line. Accordingly, the device for controlling a setup/hold time of an input signal can provide a technique which can optimize the setup/hold time at a small cost in comparison with a physical metal option control system.

12 Claims, 4 Drawing Sheets

DEVICE FOR CONTROLLING A SETUP/HOLD TIME OF AN INPUT SIGNAL

BACKGROUND OF THE INVENTION

1. Field of the Invention

The present invention generally relates to a device for controlling a setup/hold time of an input signal, and more specifically, to a technique to control the setup/hold time of various control signals applied from an input buffer without physically changing the control device.

2. Description of the Prior Art

FIG. 1 is a circuit diagram illustrating a conventional device for controlling setup/hold time of input signal.

The conventional device for controlling a setup/hold time of an input signal comprises inverters IV1~IV4 for performing a driver function, MOS capacitors C1~C4 for performing a signal delay function, metal option unit 2 and 3, and a latch 4.

Here, the inverters IV1 and IV2 output signals by driving an address, a command signal or input data applied from an input buffer 1. The inverter IV3 outputs a signal by driving an output signal of the metal option unit 2. The inverter IV4 drives an output signal of the metal option unit 3 to provide a global bus line control signal GB_BL to the latch 4.

The metal option units 2 and 3 comprising metal option switches MO1~MO4 selectively control the MOS capacitors C1~C4 to control setup/hold time of the global bus line control signal GB_BL.

The MOS capacitors C1 and C2 are selectively connected to an output terminal of the inverter IV2 by the metal option switches MO1 and MO2. The MOS capacitors C3 and C4 are selectively connected to an output terminal of the inverter IV3 by the metal option switches MO3 and MO4.

The latch 4 latches the global bus line control signal GB_BL in synchronous to a clock signal CLK to output the latched signal into a global bus line (not shown). Here, in order that the global bus line control signal GB_BL inputted into the latch 4 may be valid, the global bus line control signal GB_BL should be transmitted into the latch earlier than the clock signal CLK by a predetermined time (setup time). When the latch 4 performs a latch operation in synchronous to the clock signal, a state of the global bus line control signal GB_BL should be maintained for a predetermined time (hold time).

Here, the ideal condition is that the clock signal CLK is enabled after the setup time of the global bus line control signal GB_BL has passed, and the state of the global bus line control signal GB_BL for the hold time has been maintained.

However, it is difficult to satisfy the above ideal condition because signals inputted from outside of an actual chip through the input buffer 1 are influenced by length of an internal transmission line, various noises, capacitance or resistance, and so forth.

Accordingly, the device for controlling a setup/hold time of an input signal is designed to control the setup/hold time of the global bus line control signal GB_BL by selectively connecting signal delay devices such as the MOS capacitors C1~C4.

In other words, the metal option switches MO1~MO4 requiring physical apparatus are used to regulate the setup/hold time of the global bus line control signal GB_BL. As a result, since circuits of metal layers need to be physically changed to regulate the setup/hold time, the conventional device has a problem consuming a long time and a high cost.

SUMMARY OF THE INVENTION

The present invention is directed to a device for controlling a setup/hold time of an input signal that controls a setup/hold time of various control signals applied to a global bus line according to a decoded test mode control signal.

There is provided a device for controlling a setup/hold time of an input signal, comprising: a driver for outputting a global bus line control signal by amplifying an output signal from an input buffer, a signal delay unit for delaying the global bus line control signalselectively connected to the driver, a decoding unit for outputting a test mode delay signal by decoding a test control signal for determining to control setup/hold time corresponding to the global bus line control signal, a test mode entry signal, and a test mode exit signal, and a delay control unit for controlling the setup/hold time of the global bus line control signal by selectively connecting the signal delay unit to the driver according to a state of the test mode delay signal.

DETAILED DESCRIPTION OF THE PREFERRED EMBODIMENTS

The present invention will be described in detail referring to the accompanying drawings.

Figure 1:
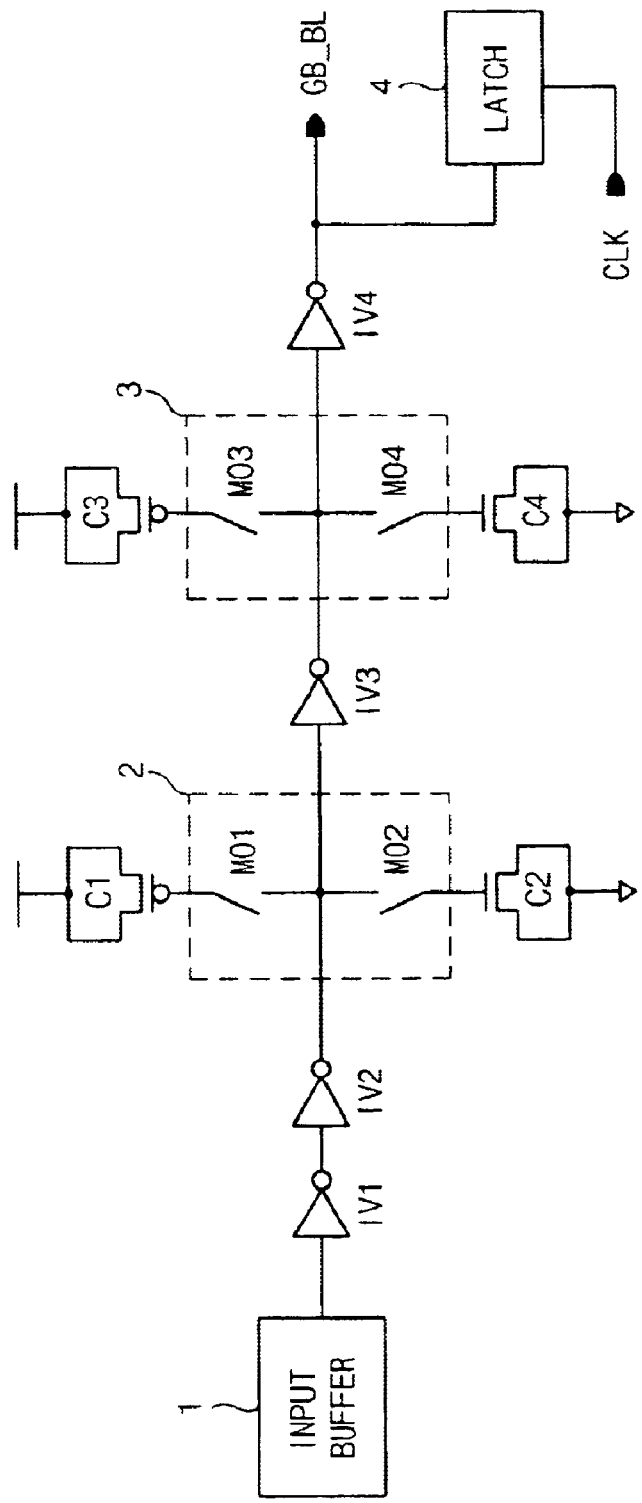
FIG. 1 is a circuit diagram illustrating a conventional device for controlling a setup/hold time of an input signal.
Figure 2:
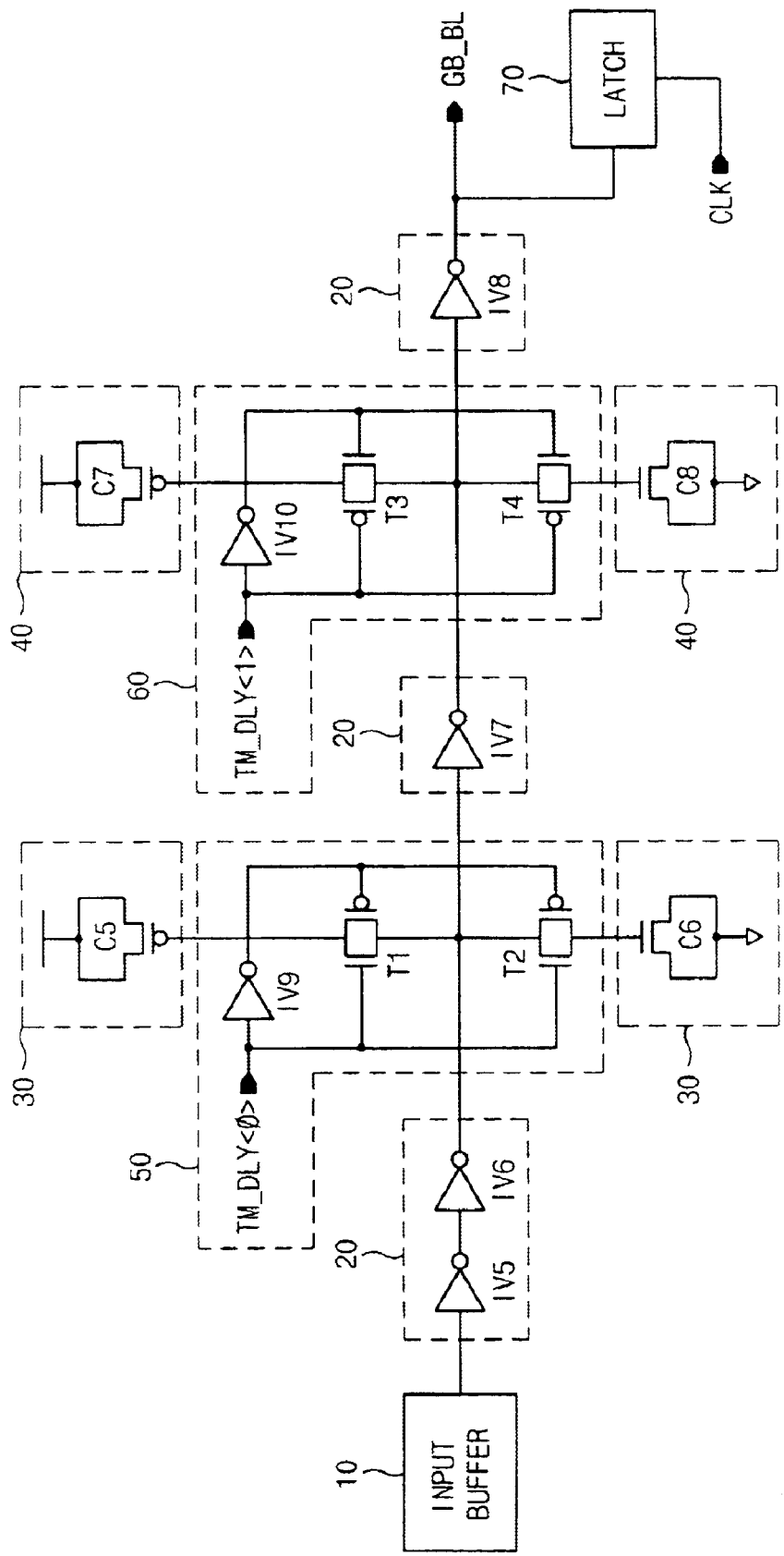
FIG. 2 is a circuit diagram illustrating a device for controlling a setup/hold time of an input signal according to an embodiment of the present invention.

FIG. 2 is a circuit diagram illustrating a device for controlling a setup/hold time of an input signal according to an embodiment of the present invention.

Referring to FIG. 2, the device for controlling a setup/hold time of an input signal of the present invention comprises a driver 20, signal delay units 30 and 40, delay control units 50 and 60, and a latch 70.

The driver 20 comprises inverters IV5~IV8 for outputting a global bus line control signal GB_BL into a latch 70 by driving an address, a command signal or input data applied from an input buffer 10. Here, the inverters IV5 and IV6 output signals by driving an output signal of the input buffer 10. The inverter IV7 outputs a signal by driving an output signal of the delay control unit 50. The inverter IV8 drives an output signal of the delay control unit 60 to provide the global bus line control signal GB_BL to the latch 70.

The signal delay unit 30 comprises MOS capacitors C5 and C6 selectively connected to an output terminal of the inverter IV6 controlled by the delay control unit 50. The signal delay unit 40 comprises MOS capacitors C7 and C8 selectively connected to an output terminal of the inverter IV7 controlled by the delay control unit 60.

The delay control unit 50 comprising an inverter IV9 and transmission gates T1 and T2 selectively connects MOS capacitors C5 and C6 to control the setup/hold time of the global bus line control signal GB_BL provided to the latch

70. The inverter IV9 inverts a test mode delay signal TM_DLY<0>. The transmission gates T1 and T2 selectively connects the MOS capacitors C5 and C6 to the output terminal of the inverter IV6 according to a state of the test mode delay signal TM_DLY<0>.

Here, the transmission gates T1 and T2 receive the test mode delay signal TM_DLY<0> through a NMOS gate, and the inversion of the test mode delay signal TM_DLY<0> by the inverter IV9 through a PMOS gate.

The delay control unit 60 comprising an inverter IV10 and transmission gates T3 and T4 selectively connects MOS capacitors C7 and C8 to control the setup/hold time of the global bus line control signal GB_BL provided to the latch 70. The inverter IV10 inverts a test mode delay signal TM_DLY<1>. The transmission gates T3 and T4 selectively connects the MOS capacitors C7 and C8 to the output terminal of the inverter IV7 according to a state of the test mode delay signal TM_DLY<1>.

Here, the transmission gates T3 and T4 receive the test mode delay signal TM_DLY<1> through a PMOS gate, and the inversion of the test mode delay signal TM_DLY<1> by the inverter IV10 through a NMOS gate.

The latch 70 latches the global bus line control signal GB_BL in synchronous to a clock signal CLK to output the latched signal into a global bus line (not shown).

Figure 3:
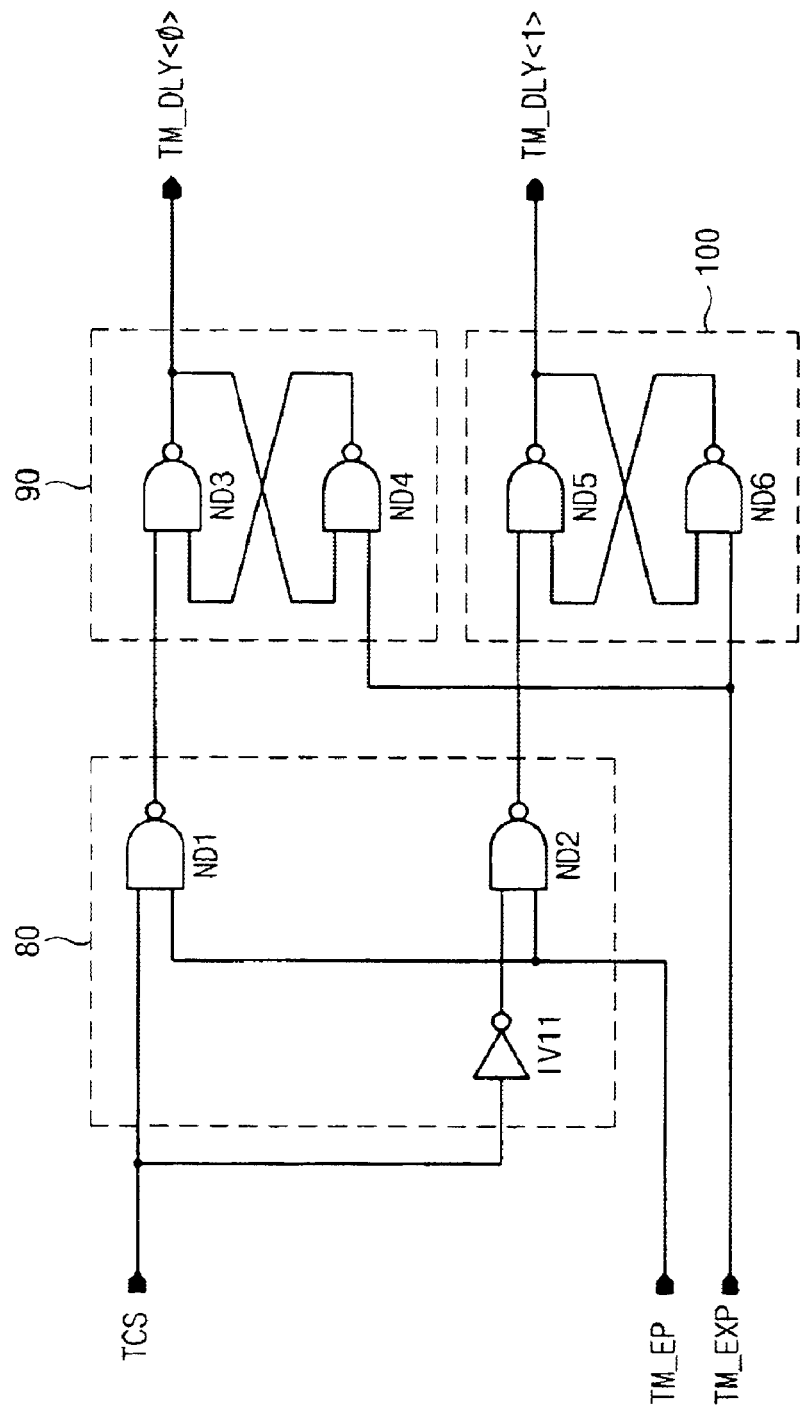
FIG. 3 is a circuit diagram illustrating a decoding unit according to an embodiment of the present invention.

FIG. 3 is a circuit diagram illustrating a decoding unit for generating the test mode delay signal TM_DLY<0> of FIG. 2.

The decoding unit comprises a logic unit 80 and latches 90 and 100. The logic unit 80 logically operates a test control signal TCS and a test mode entry signal TM_EP. The latches 90 and 100 latches output signals of the logic unit 80 and an test mode exit signal TM_EXP to output a test mode delay signals TM_DLY<1:0>.

Here, the logic unit 80 comprises an inverter IV11 and NAND gates ND1 and ND2. The inverter IV11 inverts a test control signal TCS. The NAND gate ND1 NANDs the test control signal TCS and the test mode entry signal TM_EP. The NAND gate ND2 NANDs the test mode entry signal TM_EP and an output signal of the inverter IV11.

The latch 90 comprises two cross-coupled NAND gates ND3 and ND4 with an output of a NAND gate fed back to an input of the other NAND gate. A NAND gate ND3 NANDs an output signal of the NAND gate ND1 and an output signal of the NAND gate ND4 to output the test mode delay signal TM_DLY<0>. The NAND gate ND4 NANDs the test mode exit signal TM_EXP and an output signal of the NAND gate ND3.

The latch 100 comprises two cross-coupled NAND gates ND5 and ND6 with an output of a NAND gate fed back to an input of the other NAND gate. The NAND gate ND5 NANDs an output signal of the NAND gate ND2 and an output signal of the NAND gate ND6 to output the test mode delay signal TM_DLY<1>. The NAND gate ND6 NANDs the test mode exit signal TM_EXP and an output signal of the NAND gate ND5.

Figure 4:
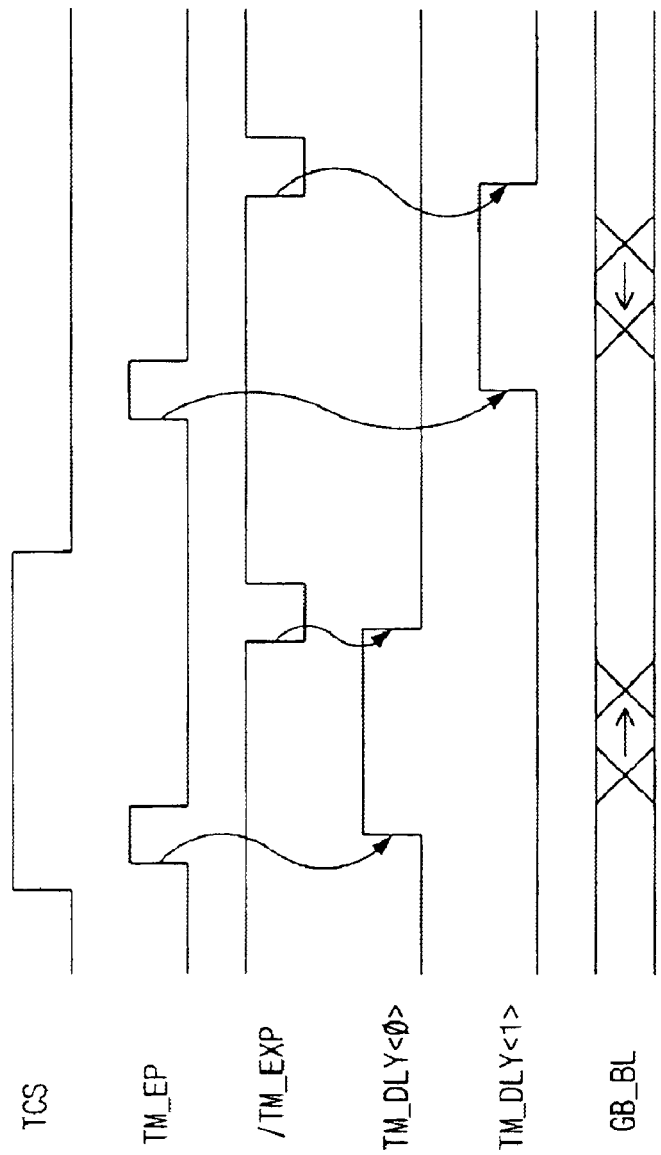
FIG. 4 is a timing diagram illustrating operation of a device for controlling a setup/hold time of an input signal according to an embodiment of the present invention.

The operation process of the device for controlling setup/hold time of input signal is described referring to FIG. 4.

In case of a normal operation mode, the test mode delay signals TM_DLY<1:0> are maintained at a low state. When the test mode delay signal TM_DLY<0> is at a low state, the transmission gates T1 and T2 are all turned off, and outputs of the MOS capacitors C5 and C6 do not affect an output terminal of the inverter IV6. When the test mode delay signal TM_DLY<1> is at a low sate, the transmission gates T3 and T4 are turned on, and an output terminal of the inverter IV7 is connected to the MOS capacitors C7 and C8. AS a result, an output signal of the inverter IV7 is delayed by the MOS capacitors C7 and C8, and the global bus line control signal GB_BL is delayed.

In order to delay the setup/hold time of the global mode delay signal GB_BL in a test mode state, the decoding unit is controlled for the test mode delay signal TM_DLY<0> to be at a high level. On the other hand, in order to advance the setup/hold time of the global bus line control signal GB_BL, the delay unit is controlled for the test mode delay signal TM_DLY<1> to be at a high level.

When the test control signal TCS is at a high level, in order to delay the setup/hold time of the global bus line control signal GB_BL, the test mode entry signal TM_EP is enabled to a high level.

When the test mode entry signal TM_EP is enabled to the high level, the NAND gate ND1 of the logic unit 80 outputs a low signal, and the NAND gate ND2 outputs a high signal. Then, the latch 90 outputs the test mode delay signal TM_DLY<0> at the high level, and the latch 100 outputs the test mode delay signal TM_DLY<1> at the low level.

Thereafter, when the test mode delay signal TM_DLY<0> becomes high, the transmission gates T1 and T2 of the delay control unit 50 are all turned on, and an output signal of the inverter IV6 is delayed by the MOS capacitors C5 and C6. When the test mode delay signal TM_DLY<1> becomes low, the transmission gates T3 and T4 of the delay control unit 60 are all turned on, and an output signal of the inverter IV10 is delayed by the MOS capacitors C7 and CB.

Next, when a test mode exit signal /TM_EXP is generated, the test mode delay signal TM_DLY<0> is disabled to the low level, and maintained at a normal state.

As a result, when the test control signal TCS is at the high level, the test mode delay signal TM_DLY<0> becomes high to delay the setup/hold time of the global bus line control signal GB_BL.

On the other hand, when the test control signal TCS becomes low, the test mode entry signal TM_EP is enabled to the high level to advance the setup/hold time of the global bus line control signal GB_BL.

When the test mode entry signal TM_EP is enabled to the high level, the NAND gate ND1 of the logic unit 80 outputs a high signal, and the NAND gate ND2 outputs a low signal. Then, the latch 90 outputs the test mode delay signal TM_DLY<0> at the low level, and the latch 100 outputs the test mode delay signal TM_DLY<1> at the high level.

Next, when the test mode delay signal TM_DLY<0> becomes low, the transmission gates T1 and T2 of the delay control unit 50 are all turned off, and output signal of the inverter IV6 is not delayed. When the test mode delay signal TM_DLY<1> becomes high, the transmission gates T3 and T4 of the delay control unit 60 are all turned off, and an output signal of the inverter IV7 is not delayed.

Thereafter, when the test mode exit signal /TM_EXP is generated, the test mode delay signal TM_DLY<1> is disabled to the low level, and maintained at a normal state.

Accordingly, when the test control signal TCS is at the low level, the test mode delay signal TM_DLY<1> becomes high to advance the setup/hold time of the global bus line control signal GB_BL.

As discussed earlier, a setup/hold time control signal of the present invention can optimize the setup/hold time at a small cost by changing the setup/hold time of outputted from an input buffer without ng the control device.

What is claimed is:

1. A device for controlling a setup/hold time of an input signal, comprising:
   a driver for outputting a global bus line control signal by amplifying an output signal from an input buffer;
   a signal delay unit for delaying the global bus line control signal selectively connected to the driver;
   a decoding unit for outputting a test mode delay signal by decoding a test control signal for determining to control setup/hold time corresponding to the global bus line control signal, a test mode entry signal, and a test mode exit signal;
   a delay control unit for controlling the setup/hold time of the global bus line control signal by selectively connecting the signal delay unit to the driver according to a state of the test mode delay signal; and
   a first latch for latching the global bus line control signal in synchronous to a clock signal.

2. The device for controlling a setup/hold time of an input signal according to claim 1, wherein the driver comprises an inverter chain including an even number of inverters connected in series for delaying and logically non-reversing the output signal from the input buffer.

3. The device for controlling a setup/hold time of an input signal according to claim 1, wherein the signal delay unit comprises:
   a first capacitor unit connected selectively to a first node of the driver controlled by the delay control unit; and
   a second capacitor unit connected selectively to a second node of the driver controlled by the delay control unit.

4. The device for controlling a setup/hold time of an input signal according to claim 3, wherein the first capacitor unit and the second capacitor unit are MOS capacitors.

5. The device for controlling a setup/hold time of an input signal according to claim 3, wherein the delay control unit comprises:
   a first delay control unit for delaying the setup/hold time of the global bus line control signal by selectively connecting the first capacitor unit to the first node according to a first state of the test mode delay signal; and
   a second delay control unit for advancing the setup/hold time of the global bus line control signal by selectively connecting the second capacitor unit to the second node according to a second state of the test mode delay signal.

6. The device for controlling a setup/hold time of an input signal according to claim 5, wherein the first delay control unit comprises a first transmission gate and a second transmission gate for receiving the test mode delay signal through a NMOS gate, and receiving an inversion of the test mode delay signal through a PMOS gate to selectively connect the first MOS capacitor unit to the first node.

7. The device for controlling a setup/hold time of an input signal according to claim 5, wherein the second delay control unit comprises a third transmission gate and a fourth transmission gate for receiving the test mode delay signal through a PMOS gate, and receiving an inversion of the test mode delay signal through a NMOS gate to selectively connect the second capacitor unit to the second node.

8. The device for controlling a setup/hold time of an input signal according to claim 5, wherein the decoding unit connects the first capacitor unit to the first node by setting the test mode delay signal high when the test control signal is at a high level, and disconnects the second capacitor unit and the second node by setting the test mode delay signal high when the test control signal is at a low level.

9. The device for controlling a setup/hold time of an input signal according to claim 8, wherein the decoding unit comprises:
   a logic unit for logically operating the test control signal and the test mode entry signal to output a first output signal and a second output signal;
   a second latch for latching the test mode delay signal according to the first output signal and the test mode exit signal; and
   a third latch for latching the second test mode delay signal according to the second output signal and the test mode exit signal.

10. The device for controlling a setup/hold time of an input signal according to claim 9, wherein the logic unit comprises:
    a first NAND gate for NANDing the test control signal and the test mode entry signal to output the first output signal; and
    a second NAND gate for NANDing the test mode entry signal and inverted of the test control signal to output the second output signal.

11. The device for controlling a setup/hold time of an input signal according to claim 9, wherein the second latch comprises a third NAND gate and a fourth NAND gate that are cross-coupled to each other.

12. The device for controlling a setup/hold time of an input signal according to claim 9, wherein the third latch comprises a fifth NAND gate and a sixth NAND gate that are cross-coupled to each other.

* * * * *